United States Patent
Lee

(10) Patent No.: US 7,728,641 B2
(45) Date of Patent: Jun. 1, 2010

(54) APPARATUS AND METHOD FOR OUTPUTTING DATA OF SEMICONDUCTOR MEMORY APPARATUS

(75) Inventor: Dong-Uk Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 538 days.

(21) Appl. No.: 11/589,865

(22) Filed: Oct. 31, 2006

(65) Prior Publication Data
US 2007/0103209 A1 May 10, 2007

(30) Foreign Application Priority Data
Nov. 9, 2005 (KR) .................. 10-2005-0106965

(51) Int. Cl.
*H03K 5/12* (2006.01)
(52) U.S. Cl. .................. 327/170; 327/108; 327/112
(58) Field of Classification Search ......... 327/108–112, 327/170; 326/26, 27, 82, 83; 365/230.06
See application file for complete search history.

(56) References Cited

U.S. PATENT DOCUMENTS

| | | | | |
|---|---|---|---|---|
| 5,291,071 A | * | 3/1994 | Allen et al. ............... | 327/108 |
| 5,623,216 A | * | 4/1997 | Penza et al. .............. | 326/27 |
| 6,035,365 A | | 3/2000 | Farmwald et al. | |
| 6,535,020 B1 | * | 3/2003 | Yin ......................... | 326/83 |
| 6,646,483 B2 | * | 11/2003 | Shin ........................ | 327/112 |
| 6,735,128 B2 | | 5/2004 | Kim | |
| 6,986,072 B2 | | 1/2006 | Nishio et al. | |
| 2003/0174544 A1 | | 9/2003 | Kim | |

FOREIGN PATENT DOCUMENTS

| | | |
|---|---|---|
| JP | 05266222 | 10/1993 |
| JP | 2006104725 | 4/2006 |
| KR | 1019990081770 | 11/1999 |
| KR | 1020030009122 A | 1/2003 |
| KR | 1020050062036 A | 6/2005 |

* cited by examiner

*Primary Examiner*—Long Nguyen
(74) *Attorney, Agent, or Firm*—Venable LLP; Jeffri A. Kaminski

(57) ABSTRACT

An apparatus for outputting data of a semiconductor memory apparatus, which is capable of varying the slew rate and the data output timing, includes a bias generator that generates a bias having a level corresponding to a set value, a slew rate controller that controls a pull-up slew rate or a pull-down slew rate of input data on the basis of the bias generated by the bias generator, and a data outputting unit that outputs data on the basis of the slew rate controlled by the slew rate controller. Therefore, it is possible to satisfy various operational conditions without changing the structure of the circuit and to correspond rapidly and appropriately with a change of the system, which enables the applied range of the products to be extended.

16 Claims, 12 Drawing Sheets

APPARATUS AND METHOD FOR OUTPUTTING DATA OF SEMICONDUCTOR MEMORY APPARATUS

BACKGROUND

1. Technical Field

The present invention relates to a semiconductor memory apparatus, and in particular, to an apparatus and a method for outputting data of a semiconductor memory apparatus.

2. Related Art

FIG. 1 shows an apparatus for outputting data of a semiconductor memory apparatus according to the related art. Referring to FIG. 1, the data outputting apparatus comprises a predriver 10 and a main driver 20. The predriver 10 includes a pull-up circuit 11 that controls a slew rate due to pulling-up of input data and a pull-down circuit 12 that controls a slew rate due to pulling-down of input data, and the main driver 20 includes transistors P1 and N1 connected between a power terminal and a ground terminal.

The pull-up circuit 11 and the pull-down circuit 12 have the same structure. In detail, as shown in FIG. 2, the pull-up circuit 11 and the pull-down circuit 12 have an inverter structure in which transistors P2 and N2 are connected between a power terminal and a ground terminal, and a resistor R10 is connected to an output terminal.

The operation of the above-mentioned related art will be described.

When data is input to the predriver 10, an up-signal and a down signal each having a predetermined gradient are output by the pull-up circuit 11 and the pull-down circuit 12 of the predriver 10.

In this state, when the data is shifted from a high level to a low level, an off-delay of the transistor P1 of the main driver 20 is controlled by raising the level of the up-signal, and an on-delay of the transistor N1 of the main driver 20 is controlled by lowering the level of the down-signal of the transistor N1.

In contrast, when the data is shifted from a low level to a high level, an on-delay of the transistor P1 of the main driver 20 is controlled by lowering the level of the up-signal, and an off-delay of the transistor N1 of the main driver 20 is controlled by raising the level of the down signal.

The pull-up slew rate and the pull-down slew rate are controlled as described above.

However, according to the related art, a rising delay and a falling delay of the up signal and the down signal, which are the main parameters for controlling the slew rate are determined by the resistor R10 and turn on-resistances of the transistors P2 and N2.

Therefore, the data outputting apparatus of a semiconductor memory apparatus has the following problems.

It is not applicable for a system that requires a high speed operation because the slew rate is fixed by the resistor and the turn on-resistance of the transistors such that the slew rate cannot be varied.

Further, the applicable range is excessively limited due to the fixed slew rate and the fixed data output timing.

SUMMARY

Embodiments of the present invention provide an apparatus for outputting data of a semiconductor memory apparatus which is capable of varying the slew rate.

Embodiments of the present invention also provide an apparatus for outputting data of a semiconductor memory apparatus which is capable of varying the data output timing.

According to an embodiment of the present invention, an apparatus for outputting data of a semiconductor memory apparatus includes a bias generator that generates a bias having a level corresponding to a set value, a slew rate controller that controls a pull-up slew rate or a pull-down slew rate of input data on the basis of the bias generated by the bias generator, and a data outputting unit that outputs data on the basis of the slew rate controlled by the slew rate controller.

According to another embodiment of the present invention, an apparatus for outputting data of a semiconductor memory apparatus includes a bias generator that generates biases having levels corresponding to at least two set values, a slew rate controller that controls pull-up and pull-down slew rates of the input data on the basis of the biases generated by the bias generator, and a data outputting unit that outputs data on the basis of the slew rates controlled by the slew rate controller.

According to still another embodiment of the present invention, an apparatus for outputting data of a semiconductor memory apparatus includes a bias generator that generates a bias having a level corresponding to at least one set value, a delay controller that delays input data on the basis of the bias generated by the bias generator, a slew rate controller that controls a pull-up or a pull-down slew rate of input data on the basis of the bias generated by the bias generator, and a data outputting unit that outputs data on the basis of the slew rate controlled by the slew rate controller.

According to a further embodiment of the present invention, an apparatus for outputting data of a semiconductor memory apparatus includes a bias generator that generates a bias having a level corresponding to at least one set value, a delay controller that delays input data on the basis of the bias generated by the bias generator, a slew rate controller that controls a pull-up slew rate and a pull-down slew rate of the input data on the basis of the bias generated by the bias generator, and a data outputting unit that outputs data on the basis of the slew rate controlled by the slew rate controller.

According to yet another embodiment of the present invention, a method of outputting data of a semiconductor memory apparatus including a bias generating unit and a slew rate controller includes generating a bias having a level corresponding to a set value using the bias generating unit, controlling a pull-up slew rate or a pull-down slew rate of input data on the basis of the generated bias using the slew rate controller, and outputting data whose slew rate is controlled.

According to still another embodiment of the present invention, a method of outputting data of a semiconductor memory including a bias generating unit and a slew rate controller, includes generating a bias having a level corresponding to at least one set value using the bias generating unit, controlling a pull-up slew rate and a pull-down slew rate of input data on the basis of the generated bias using the slew rate controller, and outputting data whose slew rate is controlled.

According to still another embodiment of the present invention, a method of outputting data of a semiconductor memory including a bias generating unit, a delay controller, and a slew rate controller, includes generating a bias having a level corresponding to at least one set value using the bias generating unit, delaying input data by a predetermined time on the basis of a corresponding bias among generated biases using the delay controller, controlling a pull-up slew rate or a pull-down slew rate of the delayed data on the basis of a corresponding bias among the generated biases, using the slew rate controller, and outputting data whose slew rate is controlled.

According to still another embodiment of the present invention, method of outputting data of a semiconductor memory including a bias generating unit, a delay controller, and a slew rate controller, includes generating a bias having a level corresponding to at least one set value using the bias generating unit, delaying input data by a predetermined time on the basis of a corresponding bias among generated biases using the delay controller, controlling a pull-up slew rate or pull-down slew rate of input data on the basis of a corresponding bias among the generated biases using the slew rate controller, and outputting data whose slew rate is controlled.

DESCRIPTION OF EXEMPLARY EMBODIMENTS

Hereinafter, preferred embodiments of the present invention will be described below in detail with reference to the accompanying drawings.

First Embodiment

Figure 3:
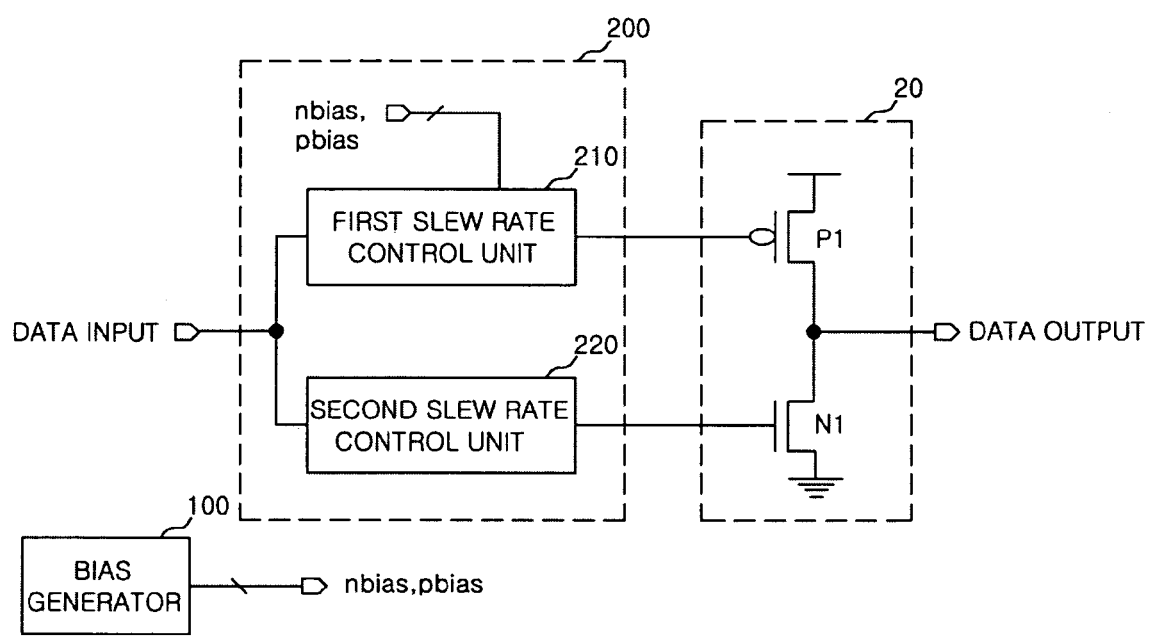
FIG. 3 is a block diagram illustrating a structure of an apparatus for outputting data of a semiconductor memory apparatus according to a first embodiment of the present invention.

As illustrated in FIG. 3, an apparatus for outputting data of a semiconductor memory apparatus includes a bias generator 100 that generates a bias having a level corresponding to a set value, a slew rate controller 200 that controls a pull-up slew rate or a pull-down slew rate of the input data on the basis of the bias generated by the bias generator 100, and a data outputting unit 20 that outputs data on the basis of the slew rate controlled by the slew rate controller 200.

Figure 4:
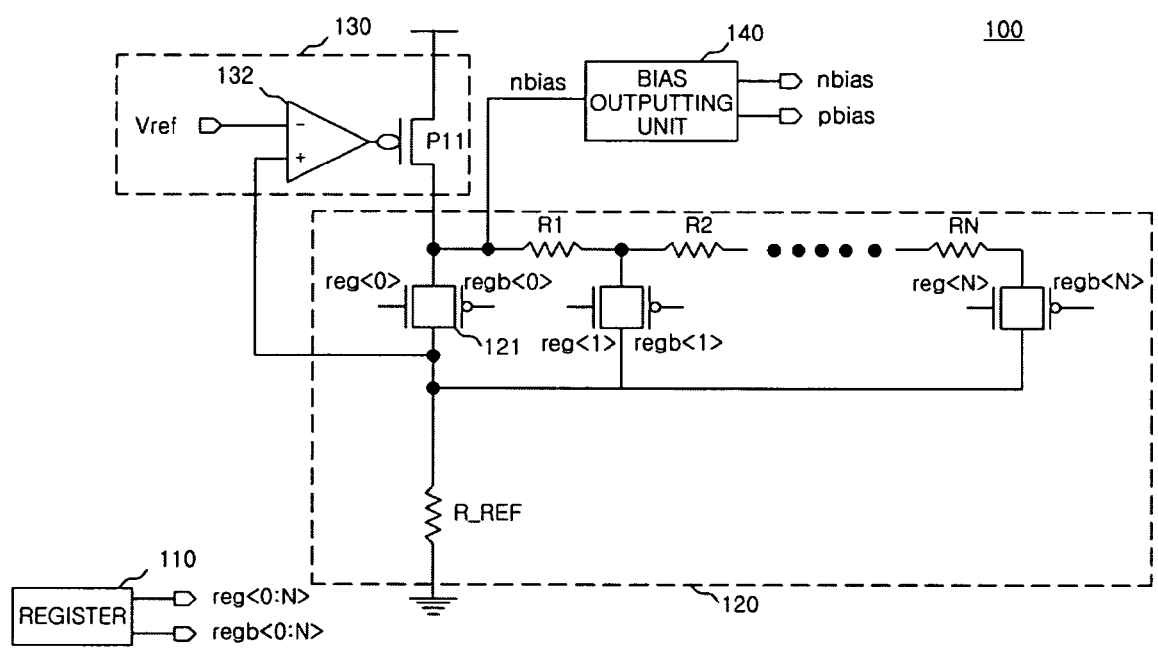
FIG. 4 is a circuit diagram illustrating a structure of a bias generator of FIG. 3.

Referring to FIG. 4, the bias generator 100 includes a register 110 that stores the set value, a level switching unit 120 that selects one of the levels on the basis of the set value, an output control unit 130 that supplies power to the level switching unit 120 and constantly maintains the amount of current in accordance to the power, and a bias outputting unit 140 that outputs a first negative bias nbias for controlling an N-type transistor and a second positive pbias for controlling a P-type transistor, from a predetermined node of the level switching unit 120.

The set value stored in the register 110 is 2 bits or more, and consists of reg0 to regN, and regb0 to regbN that are inverted from reg0 to regN. The level switching unit 120 includes a resistor array R1 to RN consisting of a plurality of resistors serially connected to each other, and a plurality of pass gates 121 serving as switching elements that are connected between a node and a ground terminal. One end of the resistor array is connected to an output terminal of the output control unit. The set values reg0 to regN, and regb0 to regbN that are inverted from reg0 to regN, are correspondingly input to each of the pass gates and the pass gates operate on the basis of the input set values. Further, the output control unit 130 has a transistor P11 connected between the power terminal and the level switching unit 120, and a differential amplifier 132. A predetermined reference voltage VREF and a predetermined node voltage of the level switching unit are input to the differential amplifier 132 and then the difference between the two voltages is output to the gate of the transistor P11.

Figure 5:
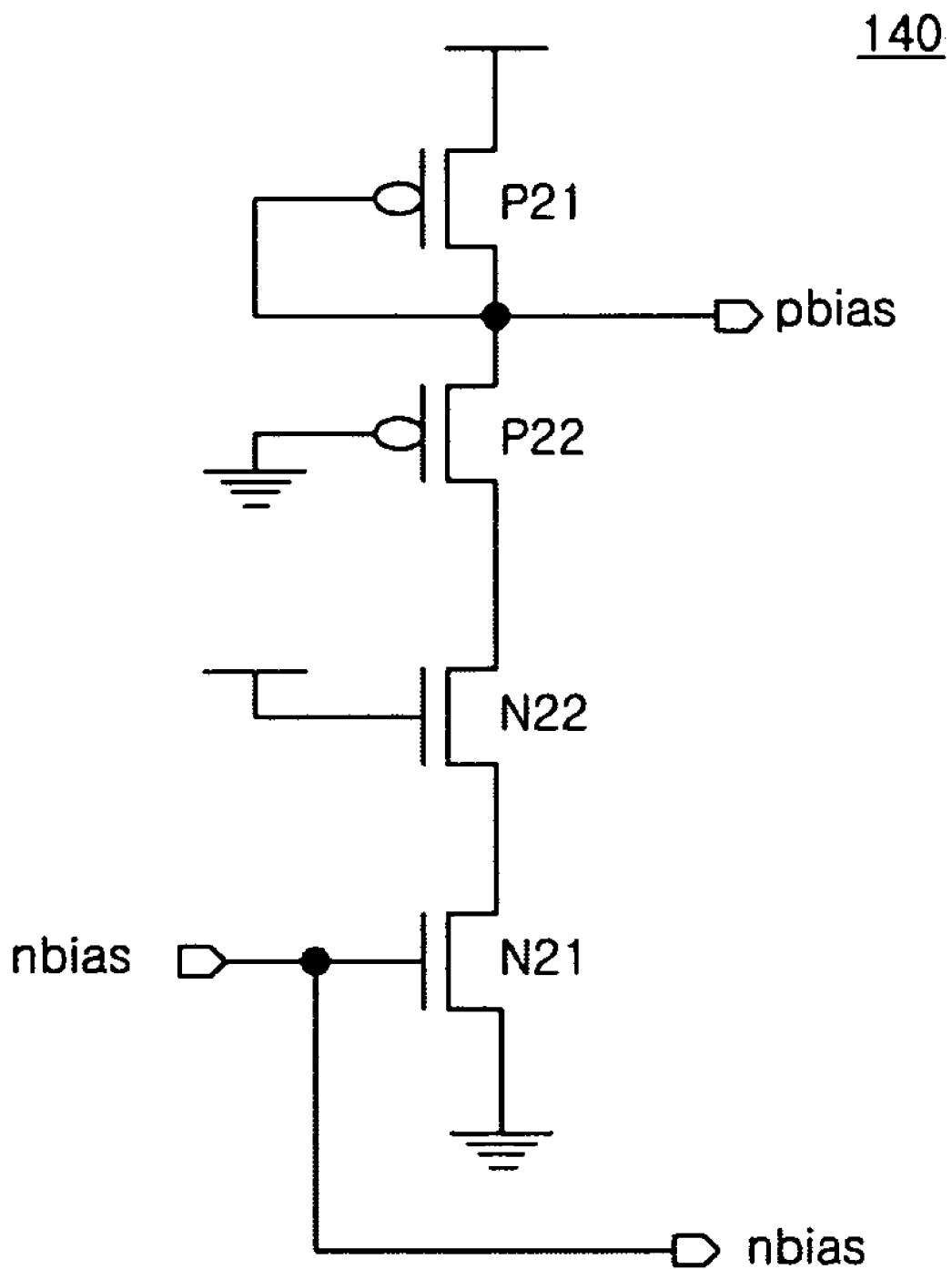
FIG. 5 is a circuit diagram illustrating a structure of a bias outputting unit of FIG. 4.

Referring to FIG. 5, the bias outputting unit 140 includes a first transistor N21, a second transistor P21, and a resistor element connected between the source of the first transistor N21 and the drain of the second transistor P21. The drain of the first transistor N21 is connected to a ground terminal and the gate thereof is applied with the first bias nbias. The source of the second transistor P21 is connected to the power terminal and the gate and drain of the second transistor P21 are connected to each other. A second bias pbias is output from the common node of the gate and the drain. The resistor element is formed of a P-type transistor P22 having a grounded gate and an N-type transistor N22 having a gate connected to the power terminal.

The slew rate controller 200 has a first slew rate control unit 210 that controls a pull-up slew rate of input data on the basis of the bias generated by the bias generator 100 and a second slew rate control unit 220 that controls a pull-down slew rate of input data. The first embodiment of this invention is to control one of the pull-up slew rate and the pull-down slew rate, and more specifically, the control of the pull-up slew rate is exemplified.

Figure 6:
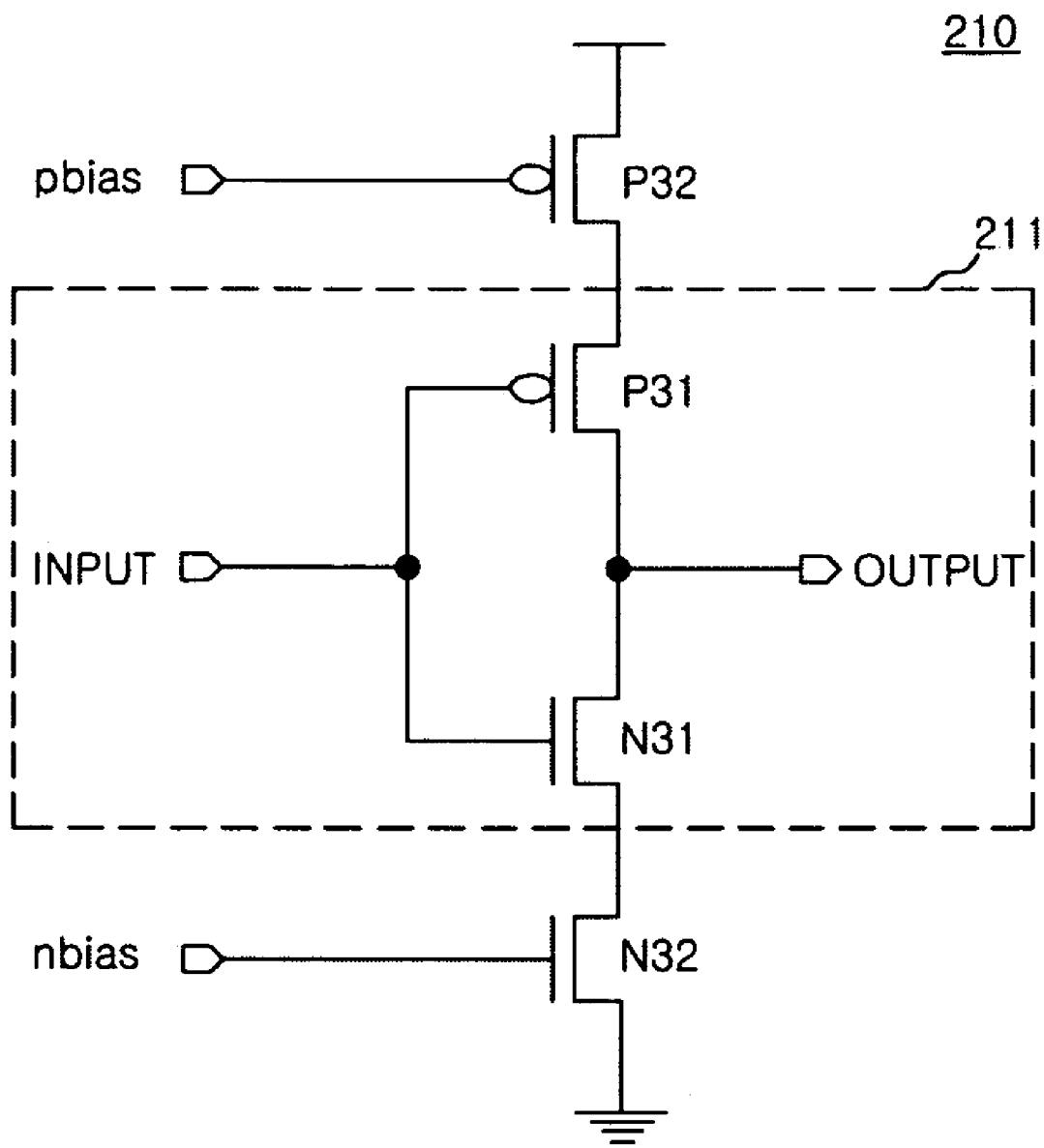
FIG. 6 is a circuit diagram illustrating a structure of a first slew rate control unit of FIG. 3.

Referring to FIG. 6, the first slew rate control unit 210 has an inverter 211 comprising a first transistor N31 and a second transistor P31 that are commonly connected to a data input terminal, a third transistor N32 that is connected between the ground terminal and the first transistor N31, which operates on the basis of the first bias nbias, and a fourth transistor P32 that is connected between a power terminal and the second transistor P31, which operates on the basis of the second bias pbias.

Figure 7:
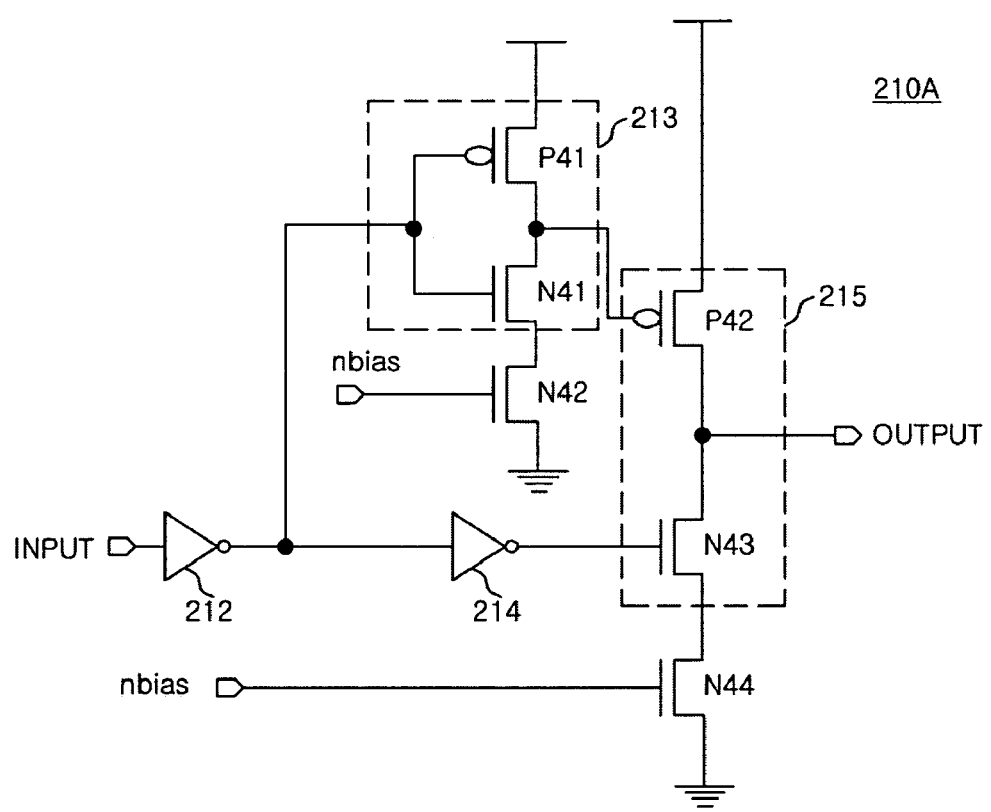
FIG. 7 is a circuit diagram illustrating another structure of a first slew rate control unit of FIG. 3.

When an external voltage is extremely low, that is, when low power is supplied to a mobile apparatus in order to reduce power consumption, and if two or more P-type transistors are connected in series, the operational performance is lowered. Therefore, in order to prevent the lowering of the operational performance, a first slew rate control unit 210A is provided so as not to connect the P-type transistors in series, as illustrated in FIG. 7. The first slew rate control unit 210A includes a first inverter 212 connected to a data input terminal, a second inverter 213 having a first transistor N41 and a second transistor P41 commonly connected to an output terminal of the first inverter 212, a third transistor N42 that is connected between the ground terminal and the first transistor N41 of the second inverter 213, and which operates on the basis of the first bias nbias, a third inverter 214 that is connected to an output terminal of the first inverter 212, a slew rate outputting unit 215 having a fourth transistor N43 connected to the output terminal of the third inverter 214 and a fifth transistor N42 connected to an output terminal of the second inverter 213, and a sixth transistor N44 that is connected between the fourth transistor N43 of the slew rate outputting unit 215 and the ground terminal, and which operates on the basis of the first bias nbias.

Figure 1:
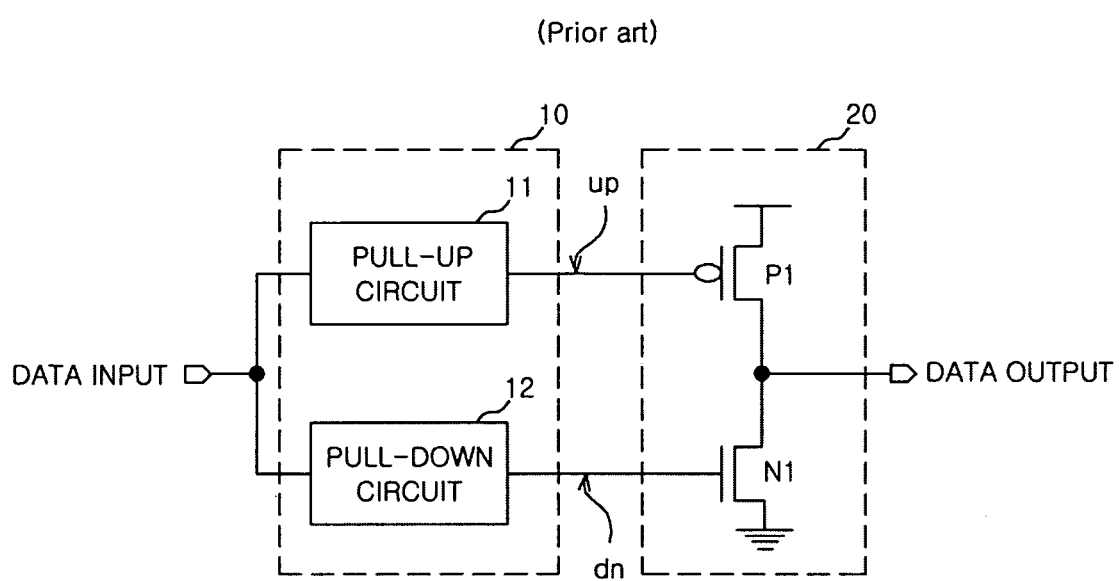
FIG. 1 is a block diagram illustrating a structure of an apparatus for outputting data of a semiconductor memory apparatus according to the related art.
Figure 2:
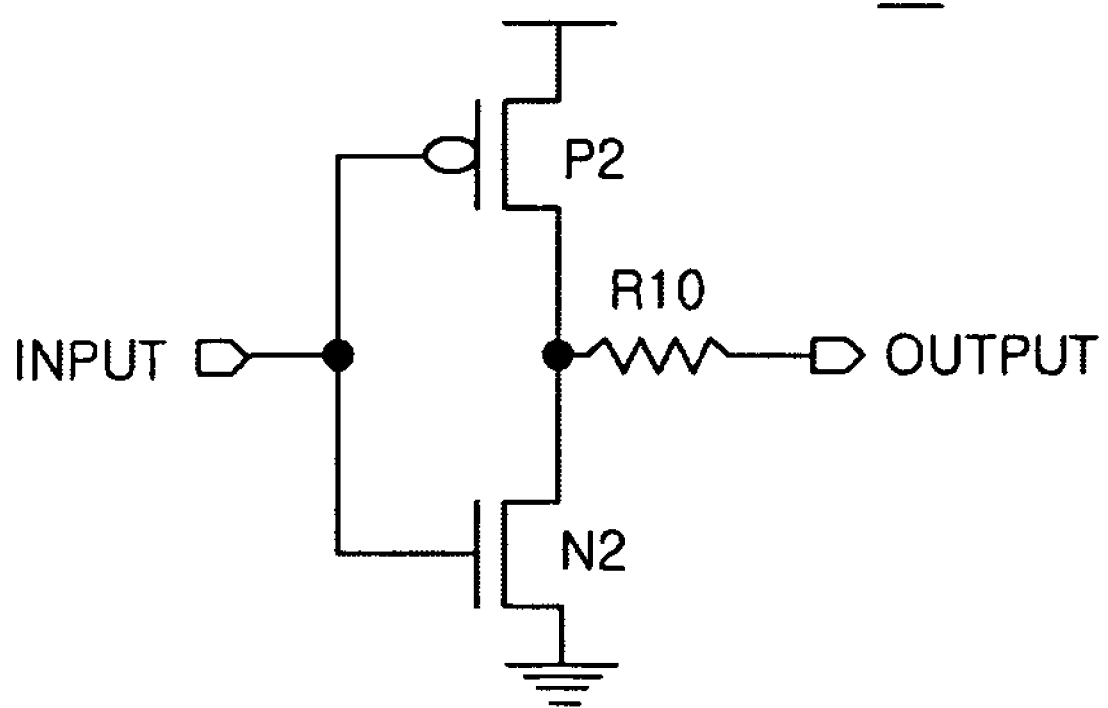
FIG. 2 is a circuit diagram illustrating a structure of a pull-up circuit of FIG. 1.

Since the second slew rate control unit 220 has the same structure as the pull-down circuit 12 according to the related art illustrated in FIG. 2, the description will be omitted.

The data outputting unit 20 (FIG. 3) includes a first transistor P1 and a second transistor N1 whose gates are connected to output terminals of the first slew rate control unit 210 and the second slew rate control unit 220, respectively, and whose drains are connected to each other. A drain connecting the node of the transistors P1 and N1 is connected to a data output terminal.

The operation of the first embodiment of this invention having the above structure will now be described.

An operator determines a set value using a mode register set (MRS) after completing the manufacturing process or mass production, and then stores the value in the register 110 of the bias generator 100 illustrated in FIG. 4.

In this case, the resistance of the resistor array R0 to RN of the level switching unit 120 in the bias generator 100 is a known value. Therefore, by determining the set value, that is, an n-bit register value reg0 to regN, the corresponding pass gate 121 is turned on, and then the voltage level of the first bias nbias is determined by a distributing resistor connected to the pass gate. The level of the bias voltage can be changed at any time by changing the register value using the MRS.

The output control unit 130 of the bias generator 100 controls the transistor P11 depending on the difference between the reference value VREF of the differential amplifier 132 and the voltage at a node connected to the level switching unit 120 to supply a constant current to the level switching unit 120.

The bias outputting unit 140 of the bias generator 100 outputs a first bias nbias from a node connected to the level switching unit 120 and then generates a second bias pbias using the first bias nbias to output it.

In this case, the bias outputting unit 140 serves as a current mirror so as to maintain the same absolute values of the first bias voltage and the second bias voltage.

Therefore, the first slew rate control unit 210 illustrated in FIG. 6 controls the data pull-up slew rate depending on the levels of the first bias nbias and the second bias pbias. In detail, the gate level of the transistor N32 is determined on the basis of the level of the first bias nbias, and the gate level of the transistor P32 is determined on the basis of the level of the second bias. That is, the slew rate is determined on the basis of the amount of the bias level.

Further, the data output is performed through the data outputting unit 20 on the basis of the pull-up slew rate and the pull-down slew rate.

Therefore, as described above, the first embodiment of this invention can control the pull-up slew rate or the pull-down slew rate so as to be suitable for the applied system corresponding to the set register value.

Second Embodiment

Figure 8:
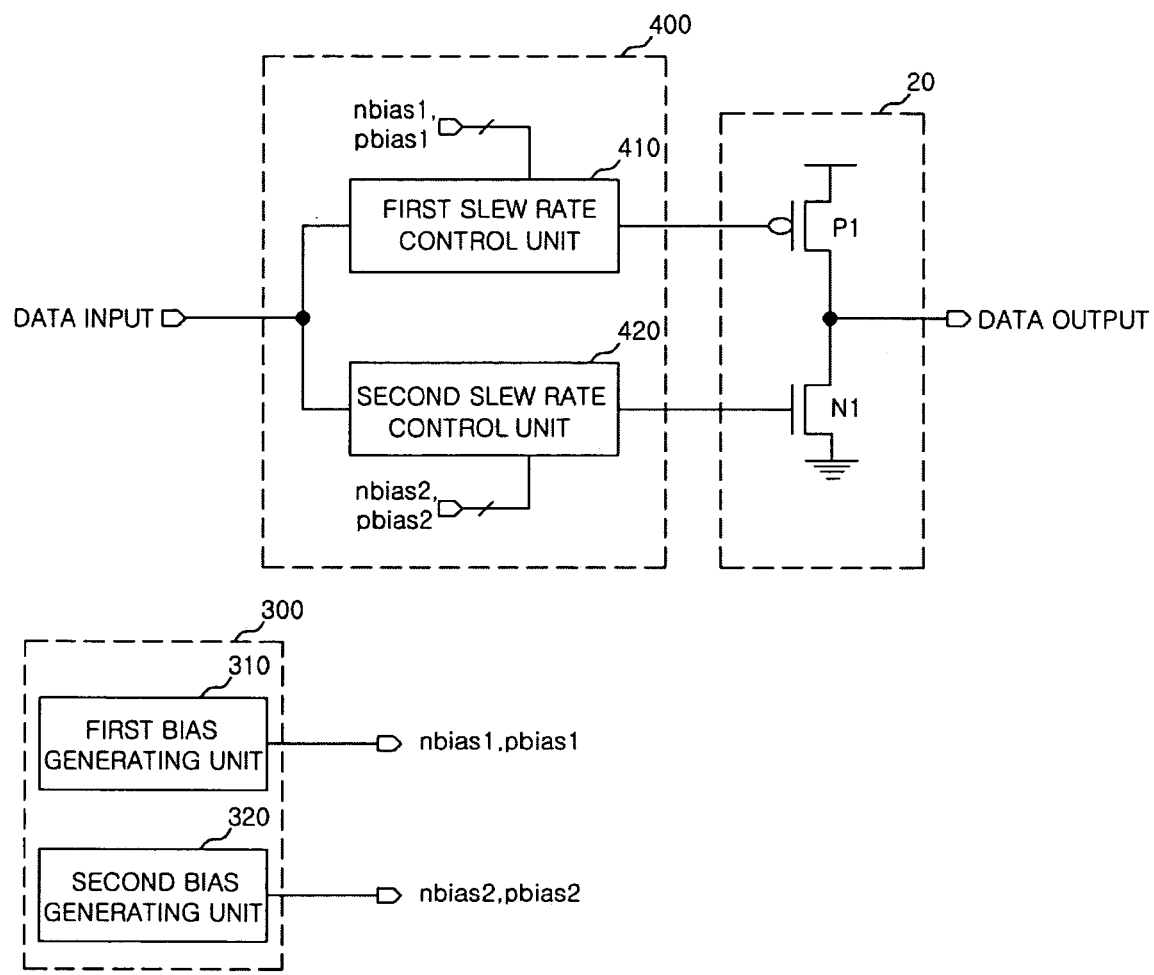
FIG. 8 is a block diagram illustrating a structure of an apparatus for outputting data of a semiconductor memory apparatus according to a second embodiment of this invention.

Referring to FIG. 8, an apparatus for outputting data of a semiconductor memory apparatus according to a second embodiment of this invention has a bias generator 300 that generates a bias having a level corresponding to at least one set value, a slew rate controller 400 that controls a pull-up slew rate and a pull-down slew rate of input data on the basis of the bias generated by the bias generator 300, and a data outputting unit 20 that outputs data depending on the slew rate controlled by the slew rate controller 400.

The bias generator 300 has a first bias generating unit 310 that generates a bias for controlling the data pull-up slew rate on the basis of a first set value, and a second bias generating unit 320 that generates a bias for controlling the data pull-down slew rate on the basis of a second set value. In this case, since the first bias generating unit 310 may be configured as illustrated in FIG. 4 of the first embodiment, and the second bias generating unit 320 may have the same structure as the first bias generating unit 310, the description thereof will be omitted. The first bias generating unit 310 generates a first bias nbias1 and a second bias pbias1 having levels corresponding to the first set value, and the second bias generating unit 320 generates a first bias nbias2 and a second bias pbias2 having levels corresponding to the second set value. As described above, since the bias levels output from the first bias generating unit 310 and the second bias generating unit 320 are determined by the corresponding set values, respectively, it is possible to control the bias levels to have the same value or different values.

The slew rate controller 400 includes a first slew rate control unit 410 that controls the pull-up slew rate of the input data on the basis of the bias generated by the first bias generating unit 310, and a second slew rate control unit 420 that controls the pull-down slew rate of the input data on the basis of the bias generated by the second bias generating unit 320. The first slew rate control unit 410 may have the same structure as the first embodiment as illustrated in FIGS. 6 and 7, and the second slew rate control unit 420 may have the same structure as the first slew rate control unit 410. Therefore, the structures thereof will be omitted.

The data outputting unit 20 has a first transistor P1 and a second transistor N1 whose gates are respectively connected to the output terminals of the first slew rate control unit 410 and the second slew rate control unit 420 and whose drains are connected to each other. A drain connecting node is connected to the data output terminal.

The operation of the second embodiment of this invention having the above structure will now be described. In this case, structures of the first bias generating unit 310, the second bias generating unit 320, the first slew rate control unit 410, and the second slew rate control unit 420 are described with reference to FIGS. 4 and 6.

An operator determines set values of the first bias generating unit 310 and the second bias generating unit 320 using a mode register set (MRS) after completing the manufacturing process or mass production, and then stores the values in the registers.

In this case, resistances of the resistor array R0 to RN of the level switching unit 120 illustrated in FIG. 4 serving as the internal structures of the first bias generating unit 310 and the second bias generating unit 320 are known values. Therefore, by determining the set value, that is, an n-bit register value reg0 to regN, the corresponding pass gate 121 is turned on, and then voltage levels of the first biases nbias1 and nbias2 are determined by a distributing resistor connected to the pass gate. The levels of the bias voltages can be changed at any time by changing the register value using the MRS.

The output control unit 130 controls the transistor P11 depending on the difference between the reference value VREF of the differential amplifier 132 and a voltage at a node connected to the level switching unit 120 to supply a constant current to the level switching unit 120.

The bias outputting units 140 of the first bias generating unit 310 and the second bias generating unit 320 output first biases nbias1 and nbias2 from the level switching unit 120 and then generate second biases pbias1 and pbias2 using the first biases to output them.

In this case, the bias outputting unit 140 serves as a current mirror so as to maintain the same absolute values of the voltage levels of the first biases nbias1 and nbias2 and the second biases pbias1 and pbias2.

Therefore, the first slew rate control unit 410 controls the data pull-up slew rate depending on the levels of the first bias nbias1 and the second bias pbias1 output from the first bias generating unit 310.

Further, the second slew rate control unit 420 controls the data pull-down slew rate depending on the levels of the first bias nbias2 and the second bias pbias2 output from the second bias generating unit 320.

In detail, the gate level of the transistor N32 illustrated in FIG. 6 is determined on the basis of the level of the first biases nbias1 and nbias2, and the gate level of the transistor P32 is determined on the basis of the level of the second biases pbias1 and pbias2. That is, the slew rate is determined on the basis of the height of the bias level.

Further, the data output is performed through the data outputting unit 20 on the basis of the pull-up slew rate and the pull-down slew rate.

Therefore, as described above, the second embodiment of this invention can independently control the pull-up slew rate or the pull-down slew rate so as to be appropriate for the property of the applied system corresponding to the set register value.

Third Embodiment

Figure 9:
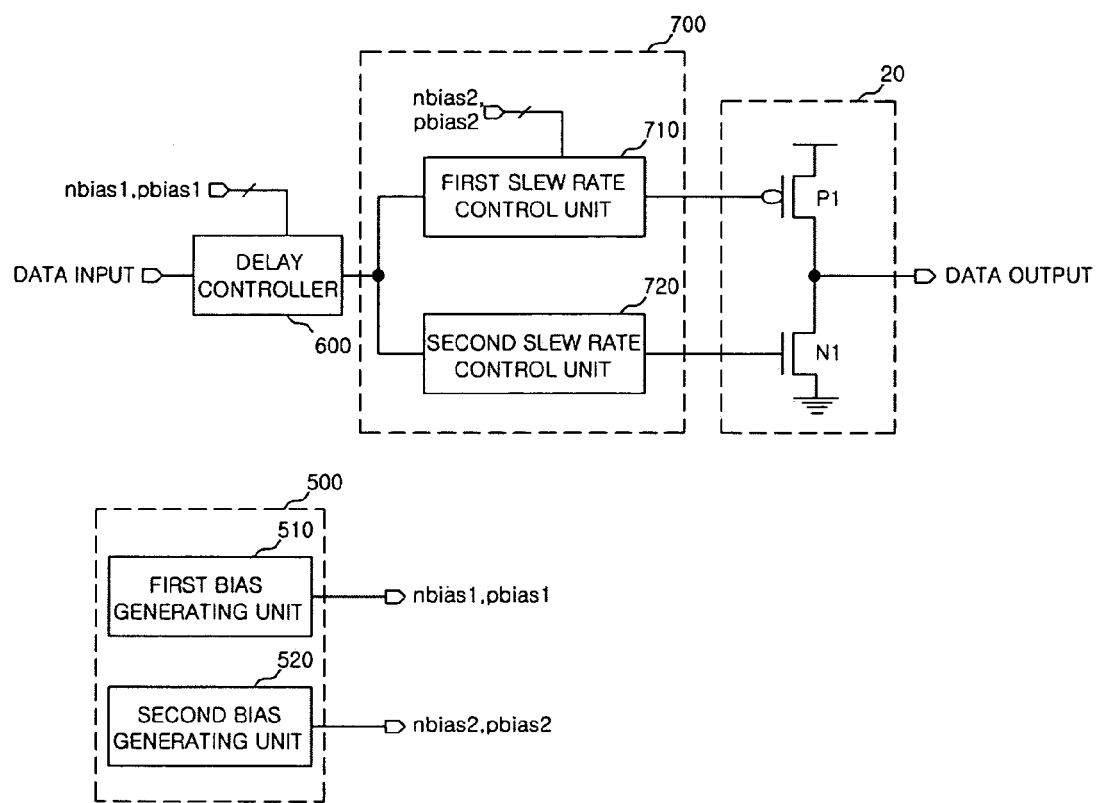
FIG. 9 is a block diagram illustrating a structure of an apparatus for outputting data of a semiconductor memory apparatus according to a third embodiment of this invention.

As illustrated in FIG. 9, an apparatus for outputting data of a semiconductor memory apparatus according to a third embodiment includes a bias generator 500 that generates a bias having a level corresponding to at least one set value, a delay controller 600 that delays input data on the basis of the bias generated by the bias generator 500, a slew rate controller 700 that controls a pull-up slew rate or a pull-down slew rate of the input data on the basis of the bias generated by the bias generator 500, and a data outputting unit 20 that outputs data on the basis of the slew rate controlled by the slew rate controller 700.

The bias generator 500 includes a first bias generating unit 510 that generates a bias for determining a delay time of the data on the basis of a first set value, and a second bias generating unit 520 that generates a bias for controlling a data pull-up slew rate on the basis of a second set value.

In this case, since the first bias generating unit 510 may have the same structure as the first embodiment as illustrated in FIG. 4, and the second bias generating unit 520 may have the same structure as the first bias generating unit 510, the description thereof will be omitted. The first bias generating unit 510 generates a first bias nbias1 and a second bias pbias1 having levels corresponding to the first set value, and the second bias generating unit 520 generates a first bias nbias2 and a second bias pbias2 having levels corresponding to the second set value. As described above, since the bias levels output from the first bias generating unit 510 and the second bias generating unit 520 are determined by the corresponding set values, respectively, it is possible to control the bias levels to have the same value or different values.

Figure 10:
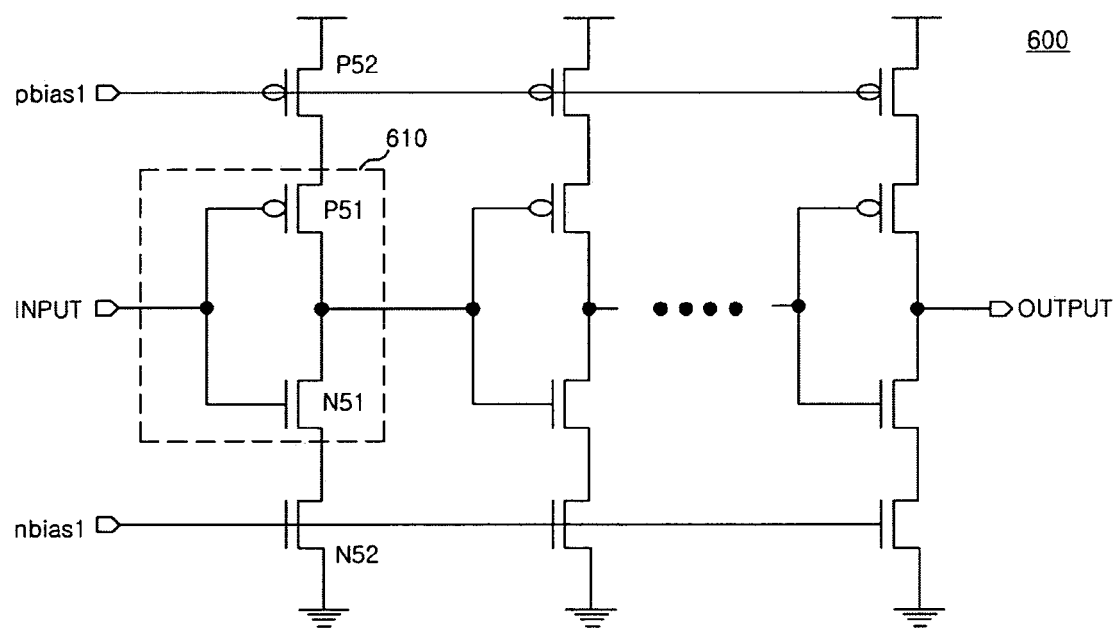
FIG. 10 is a circuit diagram illustrating a structure of a delay controller of FIG. 9.

Referring to FIG. 10, the delay controller 600 has an inverter chain in which a plurality of inverters 610 consisting of transistors P51 and N51 are connected to each other, a plurality of first transistors N52 correspondingly connected between the ground and the inverters 610 and having gates applied with a first bias nbias1 generated by the first bias generating unit 510, and a plurality of second transistors P52 that are correspondingly connected between the power terminal and the inverters 610 and have gates applied with a second bias pbias1.

Figure 11:
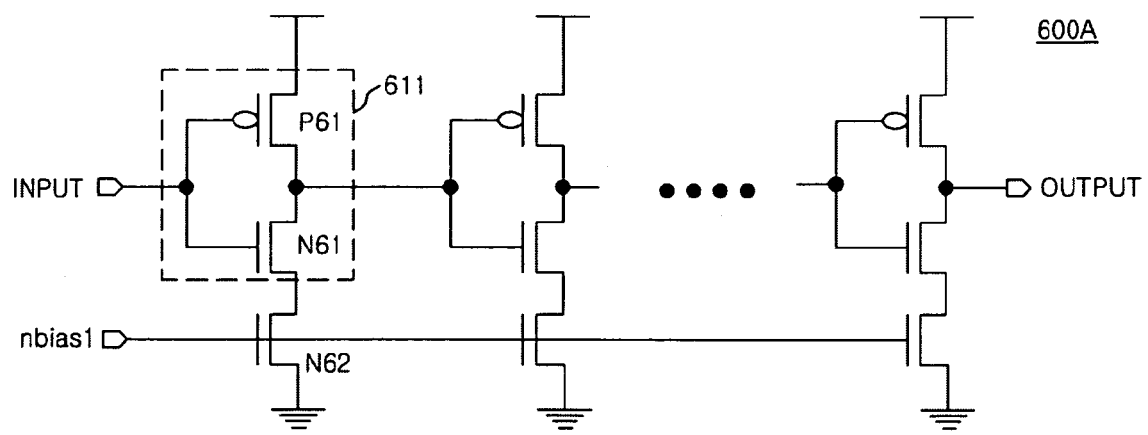
FIG. 11 is a circuit diagram illustrating another structure of a delay controller of FIG. 9.

When an external voltage is extremely low, that is, when low power is supplied to a mobile apparatus in order to reduce power consumption, if two or more P-type transistors are connected in series, the operational performance is lowered. Therefore, in order to prevent the lowering of the operational performance, a delay controller 600A is provided so as not to connect the P-type transistors in series, as illustrated in FIG. 11. The delay controller 600A includes an inverter chain in which a plurality of inverters 611 are connected to each other and a plurality of transistors N62 that are correspondingly connected between the ground terminal and the inverters 611 and have gates applied with the first bias nbias1 generated by the first bias generating unit 510.

The third embodiment of this invention is to control one of the data input timing delay, the pull-up slew rate, and the pull-down slew rate, and more specifically, the control of the pull-up slew rate is exemplified. Therefore, the slew rate controller 700 includes a first slew rate control unit 710 that controls a pull-up slew rate of input data on the basis of the bias generated by the second bias generating unit 520 and a second slew rate 720 that controls a pull-down slew rate of input data. In this case, the slew rate controller 710 may have a structure according to the first embodiment illustrated in FIGS. 6 and 7, and the second slew rate control unit 720 has the same structure as the pull-down circuit 12 illustrated in FIG. 2. Therefore, the description thereof will be omitted.

The data outputting unit 20 includes a first transistor P1 and a second transistor N1 whose gates are connected to output terminals of the first slew rate control unit 710 and the second slew rate control unit 720, respectively, and whose drains are connected to each other. The drain connecting node of the transistors P1 and N1 is connected to a data output terminal.

The operation of the third embodiment of this invention having the above structure will now be described.

The structure of the first bias generating unit 510, the second bias generating unit 520, the first slew rate control unit 710, and the second slew rate control unit 720 will be described with reference to FIGS. 4 and 6.

An operator determines set values of the first bias generating unit 510 and the second bias generating unit 520 using a mode register set (MRS) after completing the manufacturing process or mass production and then stores the set values in the registers.

In this case, resistances of the resistor array R0 to RN of the level switching unit 120 illustrated in FIG. 4 serving as the internal structures of the first bias generating unit 510 and the second bias generating unit 520 are known values. Therefore, by determining the first to third set values, that is, an n-bit register value reg0 to regN, the corresponding pass gate 121 is turned on, and then voltage levels of the first biases nbias1 and nbias2 are determined by a distributing resistor connected to the pass gate. The levels of the bias voltages can be changed at any time by changing the register value using the MRS.

The output control unit 130 controls the transistor P11 depending on the difference between the reference value VREF of the differential amplifier 132 and a voltage at a node connected to the level switching unit 120 to supply a constant current to the level switching unit 120.

Bias outputting units 140 of the first bias generating unit 510 and the second bias generating unit 520 output first biases nbias1 and nbias2 from the level switching unit 120 and then generate second biases pbias1 and pbias2 using the first biases nbias1 and nbias2 to output them.

In this case, the bias outputting unit 140 serves as a current mirror so as to maintain the same absolute values of voltage levels of the first biases nbias1 and nbias2 and the second biases pbias1 and pbias2.

Therefore, the delay controller 600 delays data by a time corresponding to a bias level generated by the first bias generating unit 510 to output the delayed data to the slew rate controller 700. In detail, referring to FIG. 10, since the gate levels of the transistors N52 and P52 are determined on the basis of the levels of the first bias nbias1 and the second bias pbias1, the delay time increases as the bias level becomes lower, and the delay time decreases as the bias level becomes higher.

The first slew rate control unit 710 controls the data pull-up slew rate depending on the levels of the first bias nbias2 and the second bias pbias2 generated by the second bias generating unit 520. In detail, the gate levels of the transistors N32 and P32 illustrated in FIG. 6 are determined on the basis of the levels of the first bias nbias2 and the second bias pbias2. That is, the slew rate is determined on the basis of the amount of the bias level.

The second slew rate control unit 720 controls the data pull-down slew rate on the basis of the preset value by the resistance of the transistors P2 and N2 and the resistor R10 as illustrated in FIG. 2.

Further, the data output is performed through the data outputting unit 20 on the basis of the pull-up slew rate and the pull-down slew rate.

Therefore, as described above, the third embodiment of this invention can independently control the output timing and the pull-up slew rate or the pull-down slew rate so as to be appropriate for the property of the applied system corresponding to the set register value.

Fourth Embodiment

Figure 12:
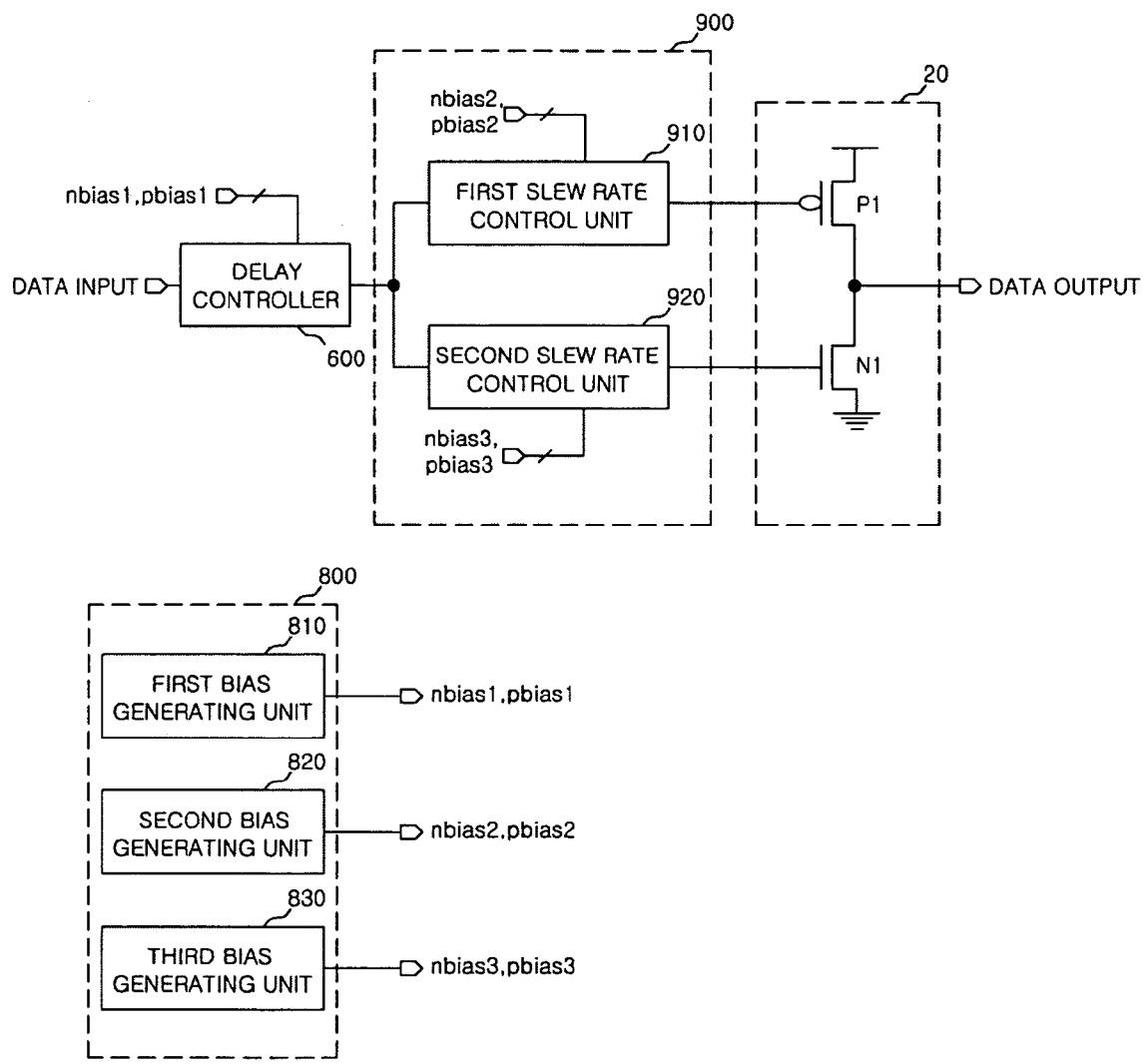
FIG. 12 is a block diagram illustrating a structure of an apparatus for outputting data of a semiconductor memory apparatus according to a fourth embodiment of this invention.

As illustrated in FIG. 12, an apparatus for outputting data of a semiconductor memory apparatus according to a third embodiment includes a bias generator 800 that generates a bias having a level corresponding to at least one set value, a delay controller 600 that delays the input data on the basis of the bias generated by the bias generator 800, a slew rate controller 900 that controls a pull-up slew rate or a pull-down slew rate of the input data on the basis of the bias generated by the bias generator 800, and a data outputting unit 20 that outputs data on the basis of the slew rate controlled by the slew rate controller 900.

The bias generator 800 includes a first bias generating unit 810 that generates a bias for determining the delay time of the data on the basis of a first set value, a second bias generating unit 820 that generates a bias for controlling a data pull-up slew rate on the basis of a second set value, and a third bias generating unit 830 that generates a bias for controlling a data pull-down slew rate on the basis of a third set value.

In this case, since the first bias generating unit 810 may have the same structure as the first embodiment as illustrated in FIG. 4, and the second bias generating unit 820 and the third bias generating unit 830 may have the same structure as the first bias generating unit 810, the description thereof will be omitted. The first bias generating unit 810 generates a first bias nbias1 and a second bias pbias1 having levels corresponding to the first set value, the second bias generating unit 820 generates a first bias nbias2 and a second bias pbias2 having levels corresponding to the second set value, and the third bias generating unit 830 generates a first bias nbias3 and a second bias pbias3 having levels corresponding to the third set value. As described above, since the bias levels output from the first to third bias generating units 810, 820 and 830 are determined by the corresponding set values, respectively, it is possible to control the bias levels to have the same value or different values.

The delay controller 600 delays the input timing of the data on the basis of the level of the first bias nbias1 and the second bias pbias1 generated by the first bias generating unit 810, and has the same structure as the third embodiment illustrated in FIGS. 10 and 11. Therefore, the description thereof will be omitted.

The slew rate controller 900 includes a first slew rate control unit 910 that controls a pull-up slew rate of input data on the basis of the bias generated by the second bias generating unit 820 and a second slew rate 920 that controls a pull-down slew rate of input data on the basis of the bias generated by the third bias generating unit 830. In this case, the first slew rate control unit 910 may have a structure according to the first embodiment illustrated in FIGS. 6 and 7, and the second slew rate control unit 920 has the same structure as the first slew rate control unit 910. Therefore, the description thereof will be omitted.

The data outputting unit 20 includes a first transistor P1 and a second transistor N1 whose gates are connected to output terminals of the first slew rate control unit 910 and the second slew rate control unit 920, respectively, and whose drains are connected to each other. A drain connecting node of the transistors P1 and N1 is connected to a data output terminal.

The operation of the fourth embodiment of this invention having the above structure will now be described. The structure of the first bias generating unit 810, the second bias generating unit 820, the third bias generating unit 830, the first slew rate control unit 910, and the second slew rate control unit 920 will be described with reference to FIGS. 4 and 6.

An operator determines set values of the first bias generating unit 810, the second bias generating unit 820, and the third bias generating unit 830 using a mode register set (MRS) after completing the manufacturing process or mass production and then stores the set values in the registers.

In this case, resistances of the resistor array R0 to RN of the level switching unit 120 illustrated in FIG. 4 serving as the internal structures of the first bias generating unit 810, the second bias generating unit 820, and the third bias generating unit 830 are known values. Therefore, by determining the first to third set values, that is, an n-bit register value reg0 to regN, the corresponding pass gate 121 is turned on, and then voltage levels of the first biases nbias1, nbias2, and nbias3 are determined by a distributing resistor connected to the pass gate. The levels of the bias voltages can be changed at any time by changing the register value using the MRS.

The output control unit 130 controls the transistor P11, depending on the difference between the reference value VREF of the differential amplifier 132 and a voltage at a node connected to the level switching unit 120 to supply a constant current to the level switching unit 120.

Bias outputting units 140 of the first bias generating unit 810, the second bias generating unit 820, and the third bias generating unit 830 output first biases nbias1, nbias2, and nbias3 from the level switching unit 120 and then generate second biases pbias1, pbias2, pbias3 using the first biases nbias1, nbias2, and nbias3 to output them.

In this case, the bias outputting unit 140 serves as a current mirror so as to maintain the same absolute values of voltage levels of the first biases nbias1, nbias2, and nbias3 and the second biases pbias1, pbias2, and pbias3.

Therefore, the delay controller 600 delays data by a time corresponding to a bias level generated by the first bias generating unit 810 to output the delayed data to the slew rate controller 900. In detail, referring to FIG. 10, since the gate levels of the transistors N52 and P52 are determined on the basis of the levels of the first bias nbias1 and the second bias pbias1, the delay time increases as the bias level becomes low, and the delay time decreases as the bias level becomes high.

The first slew rate control unit 910 controls the data pull-up slew rate depending on the levels of the first bias nbias2 and the second bias pbias2 generated by the second bias generating unit 820.

The second slew rate control unit 920 controls the data pull-down slew rate depending on the levels of the first bias nbias3 and the second bias pbias3 generated by the third bias generating unit 830.

In detail, the gate levels of the transistors N32 and P32 illustrated in FIG. 6 are determined on the basis of the levels of the first biases nbias2 and nbias3 and the second biases pbias2 and pbias3. That is, the slew rate is determined on the basis of the height of the bias level.

Further, the data output is performed through the data outputting unit 20 on the basis of the pull-up slew rate and the pull-down slew rate.

Therefore, as described above, the fourth embodiment of this invention can control independently the output timing and the pull-up slew rate or the pull-down slew rate so as to be appropriate for the property of the applied system corresponding to the set register value.

According to the above-described first to fourth embodiments of the present invention, the operation of storing the set value in the register is performed through the MRS. However, this invention is not limited thereto, and the operation of storing the set value may be performed by a separate test mode.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within the metes and bounds of the claims, or equivalents of such metes and bounds are therefore intended to be embraced by the claims.

As a result, according to the apparatus and method for outputting data of a semiconductor memory apparatus, the bias level and the slew rate can be satisfactorily controlled, and the data output time can be further controlled as desired. Therefore, it is possible to satisfy various operational conditions without changing the structure of the circuit and to correspond rapidly and appropriately with a change in the system, which enables the applied range of the products to be extended.

What is claimed is:

1. An apparatus for outputting data of a semiconductor memory apparatus, comprising:
    a bias generator configured to generate a bias by changing a power voltage using a distribution resistor whose resistance is varied depending on a register value inside the bias generator;
    a slew rate controller configured to control a pull-up slew rate or a pull-down slew rate of input data on the basis of the bias generated by the bias generator; and
    a data outputting unit configured to output data on the basis of the slew rate controlled by the slew rate controller.

2. The apparatus of claim 1,
wherein the bias generator includes:
the register configured to store the set value;
a level switching unit having a preset node and configured to select one of a number of different levels on the basis of a set value;
an output control unit configured to supply power to the level switching unit and constantly maintain an amount of current corresponding to the power; and
a bias outputting unit configured to output a first bias from the preset node of the level switching unit and a second bias generated by using the first bias.

3. The apparatus of claim 2,
wherein the set value stored in the register is 2 bit or more.

4. The apparatus of claim 2,
wherein the first bias has a positive value and the second bias has a negative value.

5. The apparatus of claim 1,
wherein the slew rate controller includes:
a first slew rate control unit configured to control the pull-up slew rate of the input data on the basis of the bias generated by the bias generator; and
a second slew rate control unit having an output terminal and configured to control the pull-down slew rate of the input data.

6. The apparatus of claim 5,
wherein the first slew rate control unit includes:
an inverter comprising a first transistor and a second transistor commonly coupled to a data input terminal;
a third transistor coupled between a ground terminal and the first transistor and configured to operate depending on the bias generated by the bias generator; and
a fourth transistor coupled between a power terminal and the second transistor and configured to operate depending on the bias generated by the bias generator.

7. The apparatus of claim 5,
wherein the first slew rate control unit includes:
an inverter comprising an output terminal and a first transistor and a second transistor commonly connected to a data input terminal;
a third transistor coupled between a ground terminal and the first transistor of the inverter and configured to operate depending on the bias generated by the bias generator;
a slew rate outputting unit comprising a fourth transistor connected to the data input terminal and a fifth transistor coupled to the output terminal of the inverter; and
a sixth transistor coupled between the fourth transistor of the slew rate outputting unit and the ground terminal and configured to operate depending on the bias.

8. The apparatus of claim 5,
wherein the second slew rate control unit includes:
a first transistor and a second transistor having gates commonly coupled to a data input terminal and having drains coupled to each other at a drain connecting node; and
a resistor coupled between the drain connecting node of the first and second transistors and the output terminal.

9. The apparatus of claim 2,
wherein the level switching unit includes:
a resistor array having one end coupled to a power terminal and including a plurality of resistors connected to each other in series, and a plurality of switching elements coupled between nodes between the resistors of the resistor array and a ground terminal and configured to operate on the basis of the corresponding set values.

10. The apparatus of claim 9,
wherein the switching elements are pass gates having control terminals configured to respectively receive the set values and inverted set values as input.

11. The apparatus of claim 2,
wherein the output control unit includes:
a transistor having a gate and coupled between a power terminal and the level switching unit; and
a differential amplifier having inputs to respectively receive a predetermined reference voltage and a predetermined node voltage of the level switching unit and to output a difference level between the reference voltage and the node voltage to the gate of the transistor.

12. The apparatus of claim 2,
wherein the bias outputting unit includes:
a first transistor having a source, a drain coupled to a ground terminal and a gate configured to receive the first bias,
a second transistor having a source coupled to a power terminal and having a gate and drain coupled to each other, a second bias being output from a node connecting the gate and the drain, and
a resistor element coupled between the source of the first transistor and the drain of the second transistor.

13. The apparatus of claim 12,
wherein the resistor element includes a P-type transistor having a gate that is grounded and an N-type transistor having a whose gate coupled to the power terminal.

14. The apparatus of claim 1,
wherein the data outputting unit includes a first transistor and a second transistor having gates coupled to the first slew rate control unit and the second slew rate control unit, respectively, and drains coupled to each other, a node connecting the drains being coupled to a data output terminal.

15. A method of outputting data of a semiconductor memory apparatus including a bias generating unit and a slew rate controller, comprising:
generating a bias having a level corresponding to a set value using the bias generating unit;
controlling a pull-up slew rate or a pull-down slew rate of input data on the basis of the generated bias using the slew rate controller; and
outputting data whose slew rate is controlled,
wherein the generating the bias comprises changing a power voltage using a distribution resistor whose resistance is varied depending on a register value inside the bias generator.

16. The method of claim 15,
wherein the controlling the pull-up slew rate or pull-down slew rate comprises controlling a pull-up or pull-down timing on the basis of the level of the generated bias.

* * * * *